United States Patent
Gröpl

(10) Patent No.: US 6,621,337 B2
(45) Date of Patent: Sep. 16, 2003

(54) POWER-EFFICIENT AMPLIFIER CIRCUIT AND PROCESS FOR POWER-EFFICIENT AMPLIFICATION OF A SIGNAL

(75) Inventor: Martin Gröpl, Sonthofen (DE)

(73) Assignee: Xignal Technologies AG, Unterhaching (DE)

( * ) Notice: Subject to any disclaimer, the term of this patent is extended or adjusted under 35 U.S.C. 154(b) by 0 days.

(21) Appl. No.: 10/016,284

(22) Filed: Oct. 30, 2001

(65) Prior Publication Data

US 2002/0121929 A1 Sep. 5, 2002

(30) Foreign Application Priority Data

Nov. 3, 2000 (DE) .......................................... 100 54 540

(51) Int. Cl.[7] .............................. H03F 3/65; H03G 3/68
(52) U.S. Cl. ..................................... 330/69; 330/124 R
(58) Field of Search ......................... 330/69, 84, 124 R, 330/149

(56) References Cited

U.S. PATENT DOCUMENTS 4,446,442 A * 5/1984 Yokoyama ................... 330/149

FOREIGN PATENT DOCUMENTS

DE 39 33 805 C2 4/1991

OTHER PUBLICATIONS

Luciano Tomasini, Alberto Gola, and Rinaldo Castello, "A Fully Differential CMOS Line Driver for ISDN", *IEEE Journal of Solid–State Circuits*, vol. 25, No. 2, Apr. 1990, pp. 546–554.

Sergio Pernici, Germano Nicollini, and Rinaldo Castello, "A CMOS Low–Distortion Fully Differential Power Amplifier with Double Nested Miller Compensation", *IEEE Journal of Solid–State Circuits*, vol. 28, No. 7, Jul. 1993, pp. 758–763.

Thomas Kaulberg, "A CMOS Current–Mode Operational Amplifier", *IEEE Journal of Solid–State Circuits*, vol. 28, No. 7, Jul. 1993, pp. 849–852.

Jim Bales, "A Low–Power, High–Speed, Current–Feedback Op–Amp with a Novel Class AB High Current Output Stage", *IEEE Journal of Solid–State Circuits*, vol. 32, No. 9, Sep. 1997, pp. 1470–1474.

* cited by examiner

*Primary Examiner*—Steven J. Mottola
(74) *Attorney, Agent, or Firm*—Pearne & Gordon LLP

(57) ABSTRACT

The invention relates to an amplifier circuit having a circuit input for a circuit input signal (Vin) to be amplified and an amplification zone for amplifying the circuit input signal (Vin).

The invention provides that the amplification zone comprises two amplifiers (OPV1, OPV2), each of which is countercoupled, and which the circuit input signal (Vin) is fed in parallel, and the amplifier outputs of which are or can be connected with a circuit output to provide a circuit output signal (Vout), wherein the amplification input zone of one of the two amplifiers (OPV1) is connected with the amplification input zone of the other of the two amplifiers (OPV2) by means of a further amplifier (A), in such manner that signal distortions at the two amplifier outputs (Vout1, Vout2) essentially cancel each other out.

The amplifier circuit according to the invention thus provides for particularly power-efficient amplification of the signal.

20 Claims, 5 Drawing Sheets

US 6,621,337 B2

POWER-EFFICIENT AMPLIFIER CIRCUIT AND PROCESS FOR POWER-EFFICIENT AMPLIFICATION OF A SIGNAL

An amplifier is a circuit that has many uses in electronics. The most important application of an amplifier is to change, and particularly to increase, the voltage level or the current intensity level of an electrical signal. Occasionally an amplifier is also used to isolate an amplifier input signal from the output, e.g. to prevent sources of noise from feeding back into the signal source.

Under most circumstances, it is desirable that the amplifier degrades the signal as little as possible. Undesirable degradation particularly includes noise and distortion.

At the same time, it is important for many applications that the amplifier's power consumption be as small as possible. A compromise must be found between these requirements when designing an amplifier, because they cannot be optimized mutually. Non-linear distortions particularly increase significantly as the amplifier design tends to favor reduced power consumption. This relationship is true in general, but is particularly marked in amplifiers that are manufactured in CMOS technology. As a result, many products can only be produced in CMOS technology if the performance is reduced or the power consumption is increased.

Figure 7:
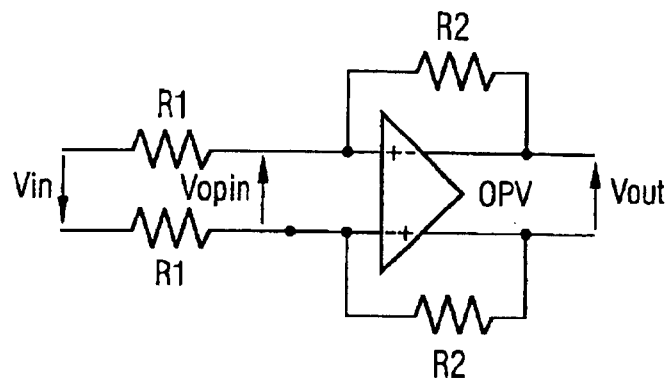

In applications for which the prime concern is to achieve a signal as free from distortion as possible, countercoupled amplifier circuits are used. FIG. 7 shows an example of a countercoupled operational amplifier OPV, which amplifies a circuit input signal Vin in conventional manner to create a circuit output signal Vout.

Figure 8:
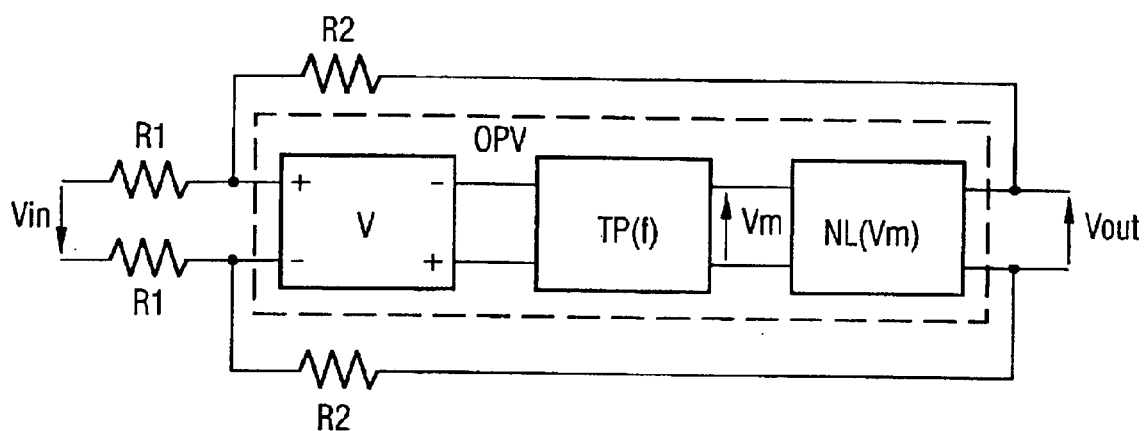
Figure 9:
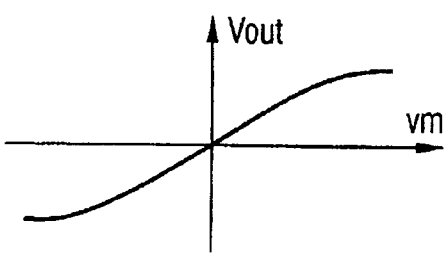

As is illustrated in FIG. 8, a good approximation of the operational amplifier OPV can be achieved with a serial connection from an ideal amplifier having frequency-independent amplification V, a low-pass filter TP(f) and a non-linear voltage transmission function NL(Vm), where f is the signal frequency and Vm is the voltage supplied to the output stage of the operational amplifier. This model is predicated on the assumption that the output stage of amplifier OPV is the dominant source of the non-linear distortion. A qualitative representation of the undesirable non-linearity NL(Vm) is shown in FIG. 9.

The non-linearity NL(Vm) is determined by the non-linear voltage-to-current characteristic of the amplifier transistors and the current that is flowing through these transistors ("transistor non-linearity"). The smaller this current is, the more marked is the non-linearity. This is the case, for instance, when the amplifier is rated to operate with a relatively small current.

The effect of the non-linearity of amplifier OPV on the signal can be reduced by countercoupling amplifier OPV, as is shown in FIG. 7. This reduction is proportional to the loop amplification $A_{loop}(f)$:

$$A_{loop}(f)=V*TP(f)*R1/(R1+R2)$$

In order to obtain a high degree of linearity of the signal, it is necessary to aim for a high loop amplification $A_{loop}(f)$ in the frequency range under consideration. To this end, the following two methods are used:

1. Use of a high transit frequency of the amplifier loop

The transit frequency $f_{transit}$ is the frequency at which the loop amplification $A_{loop}(f)$ is reduced to value 1 due to the effect of the low pass filter TP(f), i.e. $A_{loop}(f_{transit})=1$. The higher the transit frequency $f_{transit}$ is in comparison to the signal frequencies f, the lower the reduction of the loop amplification $A_{loop}$ that is caused by low-pass filter TP.

Amplifiers that use a current negative feedback ("current feedback amplifier") achieve a high transit frequency.

If the desired high linearity is obtained by means of a high transit frequency $f_{transit}$, the power consumption of the amplifier is also high. It is not possible to achieve low power consumption and high transit frequency using the transistors that are currently available. The present method is therefore appropriate only for applications in which power consumption is of lesser importance.

2. Use of multiple amplification stages connected in series

In this method, the amplification at frequencies f below the transit frequency $f_{transit}$ is raised instead of the transit frequency $f_{transit}$. This is achieved with the use of a low pass filter of a higher order. This method allows for low power consumption with high linearity of the amplifier circuit, provided signal frequencies f are sufficiently low. Amplifiers of this kind are designated, for example, by the names "Nested Miller" and "Double Nested Miller".

The advantage of having amplification stages connected in series becomes less evident as the signal frequencies f approach the transit frequency $f_{transit}$, as is shown in the following example:

With the architecture shown in FIG. 7, a sinusoidal signal having frequency f=10 MHz is to be amplified by 20 decibels (dB). Let the operational amplifier have a transit frequency of $f_{transit,amp}$=990 MHz and let the feedback have an impedance ratio R1/R2=$\frac{1}{10}$. The transit frequency of the loop amplification $f_{transit,loop}$ is then:

$$f_{transit,loop} = f_{transit,amp} * R1/(R1+R2)$$
$$= f_{transit,amp} * R1/(R1+10*R1)$$
$$= 990 \text{ MHz} * 1/11$$
$$= 90 \text{ MHz}$$

In a two-stage operational amplifier OPV with a first order low-pass filter, the amplification in this frequency range is then close to:

$$A_{loop}(f)=f_{transit,loop}/f$$

It follows that, for the third harmonic (f3) of signal frequency f, which has a frequency of 30 MHz, the loop amplification $A_{loop}(f3)$ is:

$$A_{loop}(f3)=f_{transit,loop}/f3=f_{transit,loop}/(3*10 \text{ MHz})=90 \text{ MHz}/30 \text{ MHz}=3=9.54 \text{ dB}$$

The non-linearity of the output stage at this frequency f3 is therefore reduced by 9.54 dB. If the application requires, for instance, a signal-to-distortion ratio (S/D) of 70 dB up to 30 MHz, the base linearity of the output stage must be at least 60.46 dB. This can only be achieved with very high currents (class A output stages).

If a three-stage operational amplifier ("Nested Miller" amplifier) is used, loop amplification $A_{loop}$ is increased by about 3 dB at 30 MHz. The requirement for linearity of the output stage is therefore reduced to 57.46 dB. If more amplification stages are added, the effect is negligible (<1 dB). This is because, for reasons of frequency compensation, each additional amplification stage must be slower by one third than the stage to which it is connected. If signals in the MHz frequency range with high linearity requirements have to be amplified, up to now this can only be achieved with a correspondingly high transit frequency and high output stage linearity. However, high output stage linearity and high transit frequency both lead to high power consumption.

The present invention treats in the first instance of an amplification circuit having a circuit input for a circuit input signal and an amplification zone for amplifying the circuit input signals. The present invention treats in the second instance of a process for amplifying a signal.

The object of the present invention is to provide an amplification circuit and a process for signal amplification entailing reduced power consumption, with which signal distortions can largely be precluded.

The amplification circuit according to the invention is characterized in that the amplification zone includes two amplifiers, each of which is countercoupled, and to which the circuit input signal is fed in parallel, and the amplifier outputs of which are or can be connected with a circuit output to produce a circuit output signal, wherein the amplification input zone of one of the two amplifiers is connected with the amplification input zone of the other of the two amplifiers by means of a further amplifier.

The process for signal amplification according to the invention is characterized in that the signal is amplified in parallel through two countercoupled amplifiers and the two amplifier output signals are or can be combined to produce the amplified signal, wherein a signal that has been split from the amplification input zone of one of the two amplifiers is amplified and supplied to the amplification input zone of the other of the two amplifiers.

The combination of the amplification output signals via their respective loads or working resistances (e.g. resistors, capacitors, etc.) represents a weighted addition of the amplifier output signals.

The invention further provides that as a result of this arrangement, signal distortions of the two amplifier output signals largely cancel each other out in the circuit output signal.

The basic idea of the invention consists in that, for example, for a signal having a AC component, the signal is amplified in parallel on two separate signal paths that are arranged in such manner that the two amplified signals are combined in phase at the circuit output, while the distortions are combined out of phase and preferably in opposing phase relationship. When the amplifier output signals are added at the circuit output, the wanted signals are added, but the distortions more or less cancel each other out (the signal is already improved if the distortions in two combined amplifier output signals cancel each other out at least in part).

By judicious selection of the properties of the individual amplifiers, in particular the amplification factor of the additional amplifier, it is possible to achieve almost complete cancellation of the distortion components. At the same time, the nature and magnitude of the distortions in the two amplification paths is unimportant, provided that the distortions are largely opposed to each other on the output side.

With this invention it is possible to provide amplification circuits in which the signal distortion of the circuit output signal is smaller than the signal distortions in the two amplifier output signals over wide signal frequency ranges. This applies particularly for higher portion of the frequency range as determined by product specification, which is of particular interest in practical applications.

The amplification according to the invention enables signal distortion to be largely eliminated. In addition, since the amplifiers of the circuit according to the invention can both be created considerably smaller ("scaled") than a conventional amplifier having comparable characteristics, the signal amplification according to the invention is associated with markedly lower power consumption in comparison thereto. Particularly, the individual load resistances provided for combining the signals can also be scaled, while the overall working resistance is unchanged. This scaling of associated components is particularly easy to achieve in integrated circuits on a chip if these loads are integrated with the amplifiers in question on the chip.

With the present invention, the power consumption of the amplifier circuit can thus be reduced to a minimum while largely eliminating signal distortions.

In a preferred embodiment of the invention, the two amplifiers have essentially the same configuration, but the size of the second amplifier differs from that of the first amplifier in accordance with a relative scaling factor. In this way, two amplification paths with differing signal weighting factors, but otherwise very similar characteristics are created in a very simple manner.

In a further embodiment of the invention, the two amplifiers have essentially the same configuration, but the size of the second amplifier and its working resistance differs from that of the first amplifier in accordance with a relative scaling factor s. For effective elimination of distortion in this embodiment, which is especially preferred for integrated circuits, amplification A of the additional amplifier and the relative scaling factor s should approximately satisfy the following condition: $A=1/s+1$. In this case, the distortions at the circuit output cancel each other out almost totally. The additional amplifier A should deviate from the value returned by this equation preferably by less than 20%, and more preferably by less than 10%.

In a further embodiment of the invention, the two amplifiers have essentially identical amplification properties (particularly amplification factor, distortion and working resistance) and the additional amplifier has an amplification of about 2. In this case too, the distortions at the circuit output cancel each other out almost completely. This embodiment can be realized quite simply with two identical amplifiers, each of which may be conceived, e.g. as amplifiers that have been scaled down by 50% (relative scaling factor s=1).

With regard to scaling, it is important to note the following: with modem production technologies, particularly CMOS technologies it is possible to produce transistors on a very small scale. Amplifiers almost always use transistors having dimensions that are considerably larger than the lower limit determined by production technology. In consequence, scaling such amplifiers represents no difficulties. This means, for example: if the driven working resistance of the amplifier is to be halved (=the loaded impedance is doubled), then all transistor parameters and all currents can be halved. The feedback network (cf. for instance R1, R2 in FIG. 7) can be scaled by the same factor, so that the input impedance of the overall amplification circuit is doubled. This scaling has no effect on the signal distortion caused by the amplifier. If two amplifiers, each of which has been scaled down by a factor of 50%, are connected in parallel, the overall behavior reflects that of the original unscaled amplifier, even with respect to input impedance and noise.

In a preferred embodiment of the invention, the amplification zone consists of two essentially identical amplifiers, the input zones of which are connected to one another by an additional amplifier having amplification 2. Alternatively, it is also possible to conceive of an arrangement involving further amplifiers arranged in parallel.

Amplifiers, particularly operational amplifiers, normally have a multistage configuration. An extension of the invention provides for integrating the additional amplifier in an amplification stage of the other of the two amplifiers, particularly in an input stage thereof.

Some degree of signal delay is associated with the additional amplification, and in the case of signals that vary with time, this impairs the distortion components elimination function on the output side. In order to improve the precision of the amplification, a further embodiment therefore provides for compensating for this signal delay or phase delay. Compensation of such kind is preferably integrated into the feedback path of at least one of the two amplifiers. If the two amplifiers are not identical, this compensation means may also take into account differing signal transit times of the two amplifiers.

The invention described in the foregoing allows hitherto unattainable power-efficiency in amplifiers for working resistances which can be simultaneously driven from a multiplicity of different amplifier outputs. One particularly advantageous application of the invention is, for example amplification of a control signal ("line driver").

In the circuit according to the invention, particularly the output stages of the individual amplifiers can be designed for very low power consumption, since their linearity requirements are reduced by orders of magnitude. Where previously class A amplifiers were required, this invention enables the use of classes AB or B. The economy in terms of power is then over 50% for the same total linearity. This is especially advantageous in respect of battery-powered devices. But reduced power consumption is also important for fixed-location use, since in many cases the integration density of integrated circuits cannot be increased because of the heat generated. This problem can be solved by the invention described in the foregoing.

Figure 1:
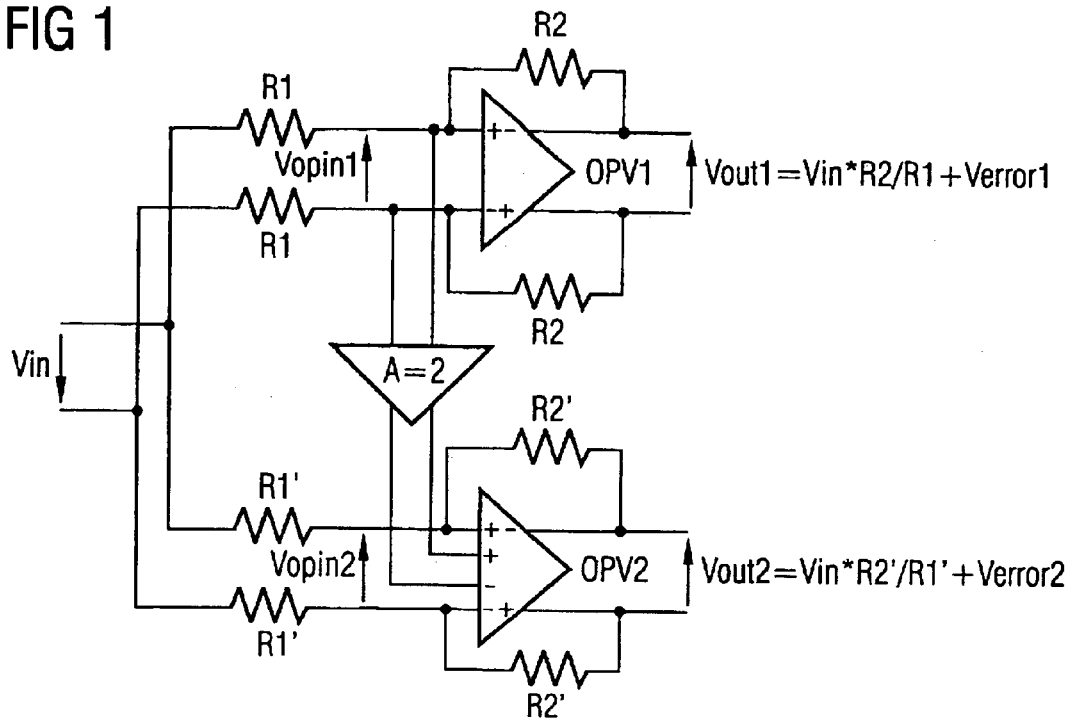
Figure 2:
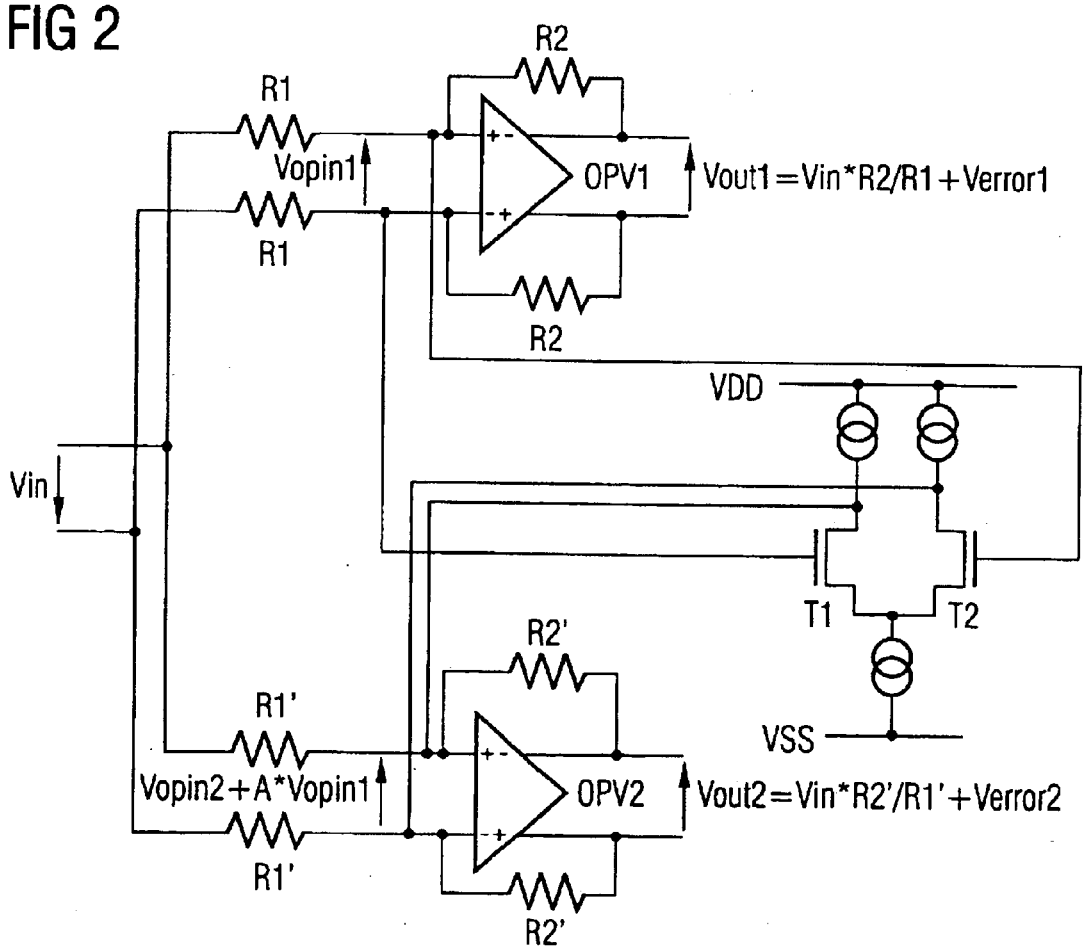
Figure 3:
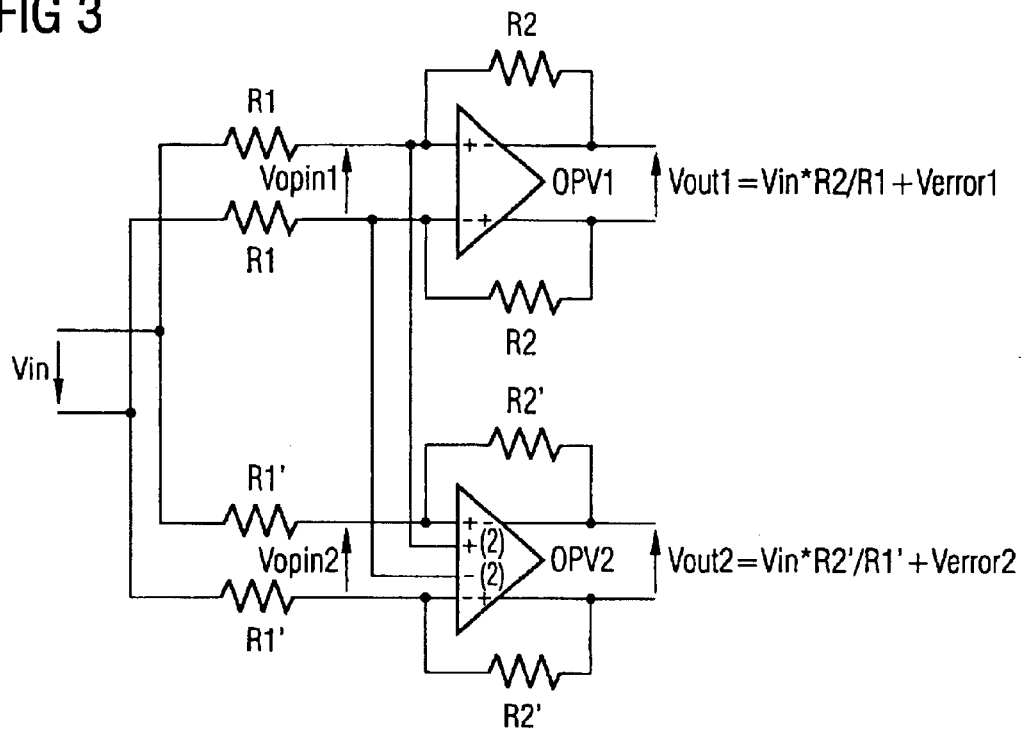
Figure 4:
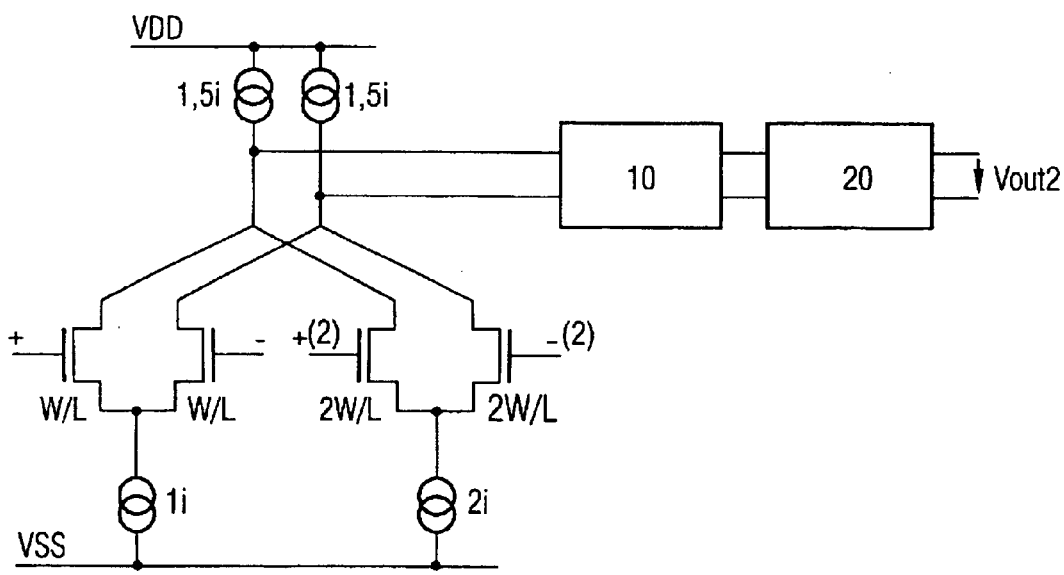
Figure 5:
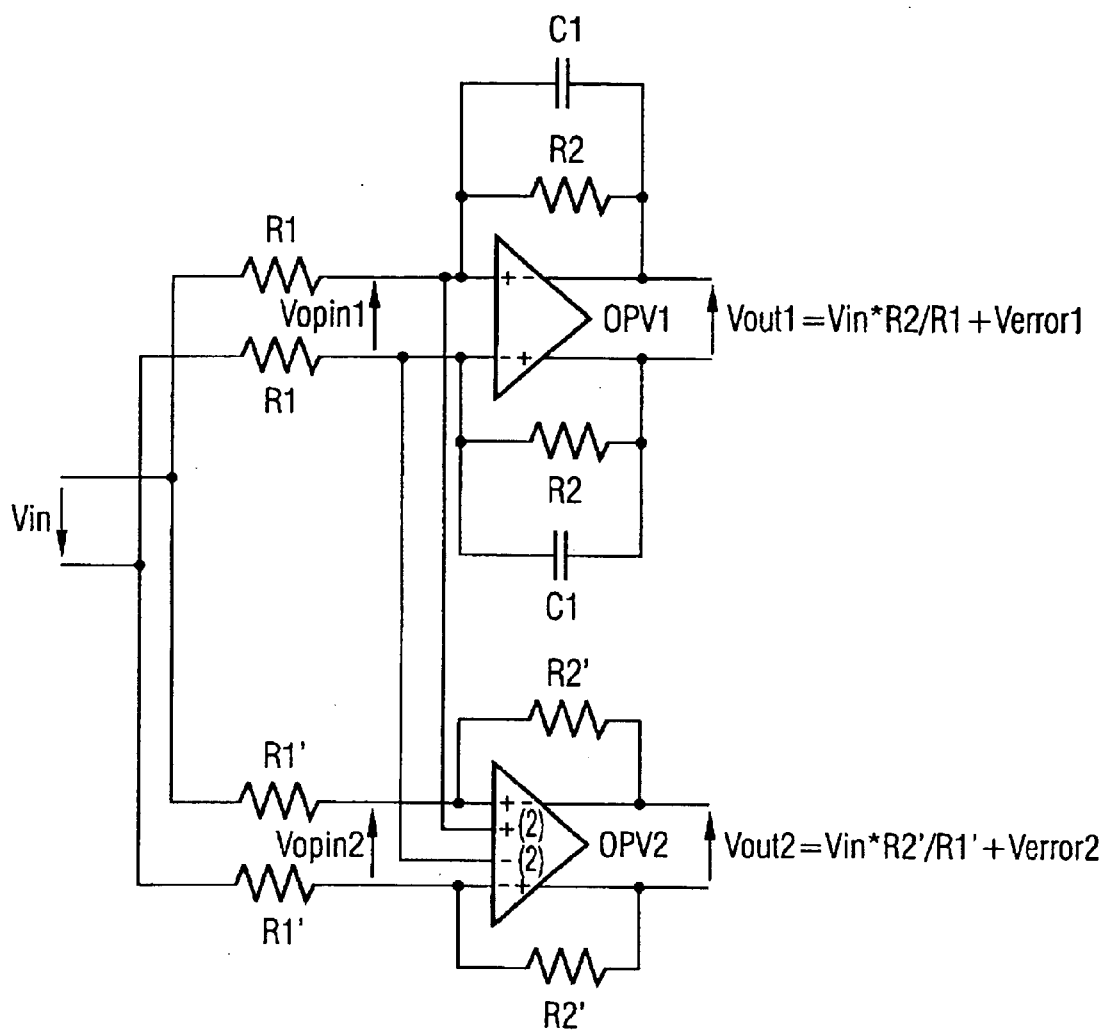
Figure 6:
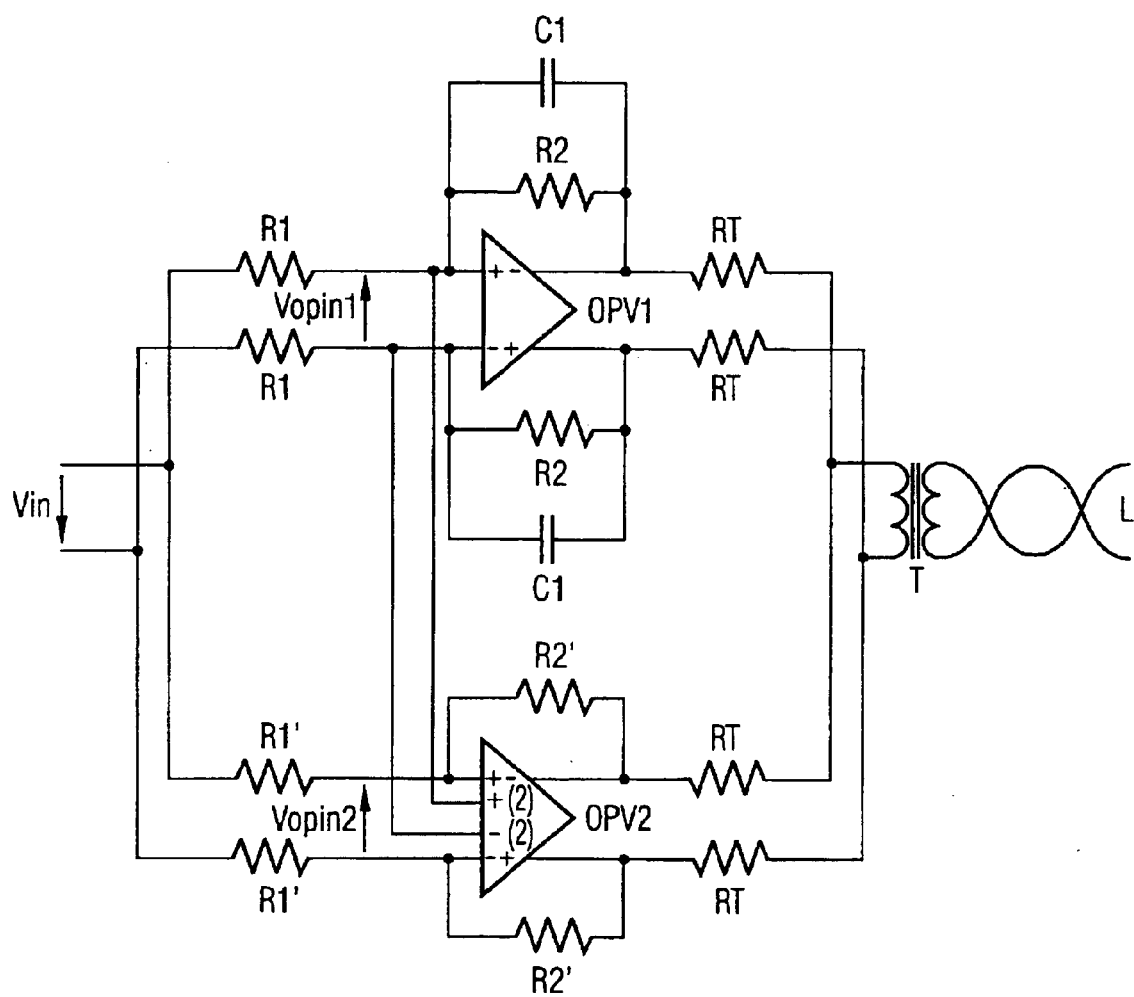

In the following, the invention will be explained in detail on the basis of exemplary embodiments and with reference to the accompanying drawings, in which:

FIG. 1 shows a embodiment of the amplification circuit according to the invention, having an architecture for the generation of diametrically opposed distorted signals in two amplification paths, FIG. 2 is a schematic diagram showing subsequent amplification by means of a transconductance amplifier, FIG. 3 is a schematic diagram showing subsequent amplification by means of scaled input stages, FIG. 4 is an exemplary illustration of the subsequent amplification by scaled input stages as shown in FIG. 3, FIG. 5 shows an embodiment of an amplification circuit according to the invention with compensation for phase delay by capacitors, FIG. 6 shows an application of the invention in a line driver, FIG. 7 shows an amplification circuit formed by a countercoupled operational amplifiers according to the prior art, FIG. 8 shows the amplification circuit according to FIG. 7 with a model of the operational amplifier used, FIG. 9 is an qualitative representation of an exemplary characteristic curve of non-linearity in conventional operational amplifiers.

FIG. 1 shows an amplifier architecture according to the invention for an integrated circuit, comprising two operational amplifiers OPV1 and OPV2, connected in parallel and each furnished with a current feedback loop across resistors R1, R2, R1', R2'. In this example, only two amplifiers are provided. Moreover, the two amplifiers OPV1 and OPV2 in the example have identical amplification characteristics.

A circuit input signal Vin is amplified by the first operational amplifier OPV1 and delivered as Vout1 at the amplifier output. Besides the desired signal (=Vin* R2/R1), this signal Vout1 also contains an undesired error signal Verror1. The same applies for the amplification path in which the second amplifier OPV2 is disposed.

Error signal Verror1 is made up of distortions, the amplification error and the noise from operational amplifier OPV1 and resistors R1, R2.

The operational amplifier input signal, designated Vopin1 in FIG. 1, is the error signal Verror1, multiplied by factor k=R1/(R1+R2), less the noise components originating from resistors R1, R2. Vopin1 is amplified by factor A=2 in an additional amplifier and supplied to the input zone of the second operational amplifier OPV2 in addition to Vopin2.

Because of the symmetrical circuit arrangement, the two signals at the input zone contribute equally to amplifier output signal Vout2. In the example shown, these two signals Vopin1*A and Vopin2 are combined in the input stage of amplifier OPV2.

Finally, a circuit output signal Vout is obtained by additive combination across identical working resistances (not shown) of the two amplifier output signals Vout1 and Vout2. The error components Verror (not including the noise components) in Vout have practically cancelled each other out.

The additional amplifier A can for example have the form of a transconductance amplifier with resistive load. FIG. 2 illustrates such a case, wherein transistors T1 and T2 function as a voltage-controlled current source (transconductance) and the feedback network (here: R1', R2') of the second operational amplifier OPV2 serves as the resistive load. The amplification in the additional amplifier A is calculated as the product of the transconductance (gm) and the effective value of the resistive load: $A=gm*1/[1/(2*R1')+1/(2*R2')]$.

FIG. 3 illustrates a particularly preferred embodiment, in which the additional amplifier is integrated in an input stage of the second amplifier OPV2. FIG. 4 is a schematic diagram showing an amplifier OPV2 configured for this purpose, having a dual input stage, the output signal from which is passed to additional amplification stages 10 and finally to an output stage 20 for outputting amplifier output signal Vout. In this example, additional amplification A and the addition is assured by the dual input stage, one of which (on the right in FIG. 4) is scaled by a factor of 2 relative to a normal input stage, so that the Vopin1 portion is amplified by a factor of 2 when it is added to the Vopin2 signal. The resulting, pre-amplified signal is then passed to additional amplification stages 10.

From the perspective of operational amplifier OPV2, this corresponds to the addition of 2*Verror to Vin. Thus a predistorted signal is passed to second amplifier OPV2. The actual distortion of first amplifier OPV1 and the estimated distortion of second amplifier OPV2 are both compensated by multiplication factor A=2. This estimation can be extremely precise if the following criteria are satisfied:

1. Both operational amplifiers OPV1 and OPV2 are identical to the degree possible.

This criterion is easily satisfied if both operational amplifiers OPV1, OPV2 are integrated on a single chip.

2. Both operational amplifiers OPV1 and OPV2 are in the same working point at all times, to the degree possible.

This criterion is satisfied if the distortions are markedly smaller than the wanted signal. In almost all applications, distortions are typically more than 20 dB below the signal level. The shift in working point caused by distortions can therefore be ignored.

Unequally scaled operational amplifiers (relative scaling factor s not equal to 1) may be used instead of two identical operational amplifiers that have each been scaled by a factor of 50% (relative to corresponding stand-alone amplifier). In general, the amplification of additional amplifier A should be roughly directly proportional to the relative scaling factor s of the second operational amplifier OPV2, to achieve the desired mutual negation of distortions (A=1/s+1).

In order to achieve a particularly high degree of precision, it is necessary to compensate for phase delay of the second operational amplifier OPV2with respect to the first operational amplifier OPV1. Otherwise, the adjusted signal reaches output Vout2 with a minimal delay. This would cause a small residual error to remain after distortion elimination.

Since the phase delay in typical operational amplifiers can be modeled by a first order low-pass filter (single-ended system) in the frequencies under consideration, it can be compensated, for example, by a capacitor (in the case of full-differential operational amplifiers, by two capacitors) in the feedback path of the first operational amplifier. This is illustrated for a full-differential operational amplifier in FIG. 5. If a C-R-C network is used instead in each case, a second pole of the operational amplifier can also be compensated. This allows the phase delay to modeled even more accurately, so that it does not represent a limiting factor for distortion suppression. Alternatively or additionally, phase errors could be compensated for example by means of a time-lag device also in the signal path of additional amplifier A and/or at least one of the joining paths.

The production tolerances of the associated processing equipment preclude very good matching of the two amplifiers. The invention described in the foregoing is therefore most suitable for use in the design of particularly power-efficient amplifiers with average linearity requirements in the region from 60 dB to 90 dB S/D. In order for the circuit to function, the driven load must also allow it to be addressed by two different amplifier outputs at the same time. This is particularly possible in all cases where the load must or may be addressed by a defined source impedance. This includes, for instance, its use as a line driver (FIG. 6), in which the amplifier output signals are combined by means of resistors RT for driving a transformer T to output an amplified signal on a line L, or in addressing inverting amplifiers. While loads (e.g. joining resistors RT) can be integrated on the same chip with the amplifiers in the amplifier circuit according to the invention, it may be preferable, with respect to more stringent production tolerances and greater flexibility in wiring if the amplifier circuit has output connections for external wiring to the loads.

What is claimed is:

1. An amplifier circuit having a circuit input for a circuit input signal (Vin) to be amplified and an amplification zone for amplifying the circuit input signal (Vin), wherein the amplification zone comprises two amplifiers (OPV1, OPV2), each of which is countercoupled, and to each of which the circuit input signal (Vin) is fed in parallel, and the amplifier outputs (Vout1, Vout2) of which are or can be connected with a circuit output to provide a circuit output signal (Vout), wherein the amplification input zone of one of the two amplifiers (OPV1) is connected with the amplification input zone of the other of the two amplifiers (OPV2) by means of a further amplifier (A), in such manner that signal distortions at the two amplifier outputs (Vout1, Vout2) essentially cancel each other out in the circuit output signal (Vout), wherein the two amplifiers (OPV1, OPV2), including their respective loads, have essentially the same configuration, but the size of the other amplifier (OPV2) and its load differs from that of the first amplifier (OPV1) in accordance with a relative scaling factor (s), and wherein the condition A=1/s+1 is at least approximately fulfilled, where A is the amplification of the additional amplifier and s is the relative scaling factor.

2. The amplifier circuit according to claim 1, wherein the two amplifiers (OPV1, OPV2) have essentially identical amplification characteristics and the additional amplifier (A) has an amplification of about 2.

3. The amplifier circuit according to claim 1, wherein the additional amplifier (A) is integrated in an input stage of the other (OPV2) of the two amplifiers (OPV1, OPV2).

4. The amplifier circuit according to claim 1, including a compensation device (R2, C1) to compensate for the signal delay caused by the other (OPV2) of the two amplifiers (OPV1, OPV2) and the additional amplifier (A).

5. A line driver, including the amplifier circuit according to claim 1, as well as a transformer (T) connected to the circuit output.

6. An amplifier circuit having a circuit input for a circuit input signal (Vin) to be amplified and an amplification zone for amplifying the circuit input signal (Vin), wherein the amplification zone comprises two amplifiers (OPV1, OPV2), each of which is countercoupled, and to each of which the circuit input signal (Vin) is fed in parallel, and the amplifier outputs (Vout1, Vout2) of which are or can be connected with a circuit output to provide a circuit output signal (Vout), wherein the amplification input zone of one of the two amplifiers (OPV1) is connected with the amplification input zone of the other of the two amplifiers (OPV2) by means of a further amplifier (A), in such manner that signal distortions at the two amplifier outputs (Vout1, Vout2) essentially cancel each other out in the circuit output signal (Vout), wherein the additional amplifier (A) is integrated in an input stage of the other (OPV2) of the two amplifiers (OPV1, OPV2).

7. The amplifier circuit according to claim 6, wherein the two amplifiers (OPV1, OPV2) have essentially identical amplification characteristics and the additional amplifier (A) has an amplification of about 2.

8. The amplifier circuit according to claim 6, including a compensation device (R2, C1) to compensate for the signal delay caused by the other (OPV2) of the two amplifiers (OPV1, OPV2) and the additional amplifier (A).

9. A line driver, including the amplifier circuit according to claim 6, as well as a transformer (T) connected to the circuit output.

10. An amplifier circuit having a circuit input for a circuit input signal (Vin) to be amplified and an amplification zone for amplifying the circuit input signal (Vin), wherein the amplification zone comprises two amplifiers (OPV1, OPV2), each of which is countercoupled, and to each of which the circuit input signal (Vin) is fed in parallel, and the amplifier outputs (Vout1, Vout2) of which are or can be connected with a circuit output to provide a circuit output signal (Vout), wherein the amplification input zone of one of the two amplifiers (OPV1) is connected with the amplification input zone of the other of the two amplifiers (OPV2) by means of a further amplifier (A), in such manner that signal distortions at the two amplifier outputs (Vout1, Vout2) essentially cancel each other out in the circuit output signal (Vout), including a compensation device (R2, C1) to compensate for the signal delay caused by the other (OPV2) of the two amplifiers (OPV1, OPV2) and the additional amplifier (A).

11. The amplifier circuit according to claim 10, wherein the two amplifiers (OPV1, OPV2) have essentially identical amplification characteristics and the additional amplifier (A) has an amplification of about 2.

12. The amplifier circuit according to claim 10, wherein the two amplifiers (OPV1, OPV2), including their respective loads, have essentially the same configuration, but the size of the other amplifier (OPV2) and its load differs from that of the first amplifier (OPV1) in accordance with a relative scaling factor (s), and wherein the condition A=1/s+1 is at least approximately fulfilled, where A is the amplification of the additional amplifier and s is the relative scaling factor, wherein the additional amplifier (A) is integrated in an input stage of the other (OPV2) of the two amplifiers (OPV1, OPV2).

13. A line driver, including the amplifier circuit according to claim 10, as well as a transformer (T) connected to the circuit output.

14. A process for amplifying a signal (Vin), wherein the signal (Vin) is amplified in parallel by two countercoupled amplifiers (OPV1, OPV2) and the two amplifier output signals (Vout1, Vout2) are or can be combined to provide the amplified signal (Vout), wherein a signal that has been split (Vopin1) from the amplification input zone of one of the two amplifiers (OPV1) is amplified (A) and supplied to the amplification input zone of the other of the two amplifiers (OPV2) in such manner that signal distortions of the two amplifier output signals (Vout1, Vout2) essentially cancel each other out in the circuit output signal (Vout), wherein amplification (A) of the split signal (Vopin1) takes place in integrated manner in an input stage of the other of the two amplifiers (OPV2).

15. The process according to claim 14, wherein the amplifications by the two amplifiers (OPV1, OPV2) are provided with essentially identical characteristics and amplification (A) of the split signal (Vopin1) is about 2.

16. The process according to claim 14, wherein a signal delay caused by the amplification of one of the two amplifiers and the amplification of the split signal (Vopin1) is compensated (R2, C1).

17. A process for driving a line signal (Vin), including the process for amplifying the line signal according to claim 14 and a subsequent transformation (T) of the amplified line signal.

18. A process for amplifying a signal (Vin), wherein the signal (Vin) is amplified in parallel by two countercoupled amplifiers (OPV1, OPV2) and the two amplifier output signals (Vout1, Vout2) are or can be combined to provide the amplified signal (Vout), wherein a signal that has been split (Vopin1) from the amplification input zone of one of the two amplifiers (OPV1) is amplified (A) and supplied to the amplification input zone of the other of the two amplifiers (OPV2) in such manner that signal distortions of the two amplifier output signals (Vout1, Vout2) essentially cancel each other out in the circuit output signal (Vout), wherein a signal delay caused by the amplification of one of the two amplifiers and the amplification of the split signal (Vopin1) is compensated (R2, C1).

19. The process according to claim 18, wherein the amplifications by the two amplifiers (OPV1, OPV2) are provided with essentially identical characteristics and amplification (A) of the split signal (Vopin1) is about 2.

20. A process for diving a line signal (Vin), including the process for amplifying the line signal according to claim 18 and a subsequent transformation (T) of the amplified line signal.

* * * * *